(12) United States Patent
Xu et al.

(10) Patent No.: US 8,705,300 B1
(45) Date of Patent: Apr. 22, 2014

(54) MEMORY ARRAY CIRCUITRY WITH STABILITY ENHANCEMENT FEATURES

(75) Inventors: Yanzhong Xu, Santa Clara, CA (US); Jeffrey T. Watt, Palo Alto, CA (US)

(73) Assignee: Altera Corporation, San Jose, CA (US)

( * ) Notice: Subject to any disclaimer, the term of this patent is extended or adjusted under 35 U.S.C. 154(b) by 32 days.

(21) Appl. No.: 12/850,528

(22) Filed: Aug. 4, 2010

Related U.S. Application Data

(62) Division of application No. 11/711,969, filed on Feb. 27, 2007, now abandoned.

(51) Int. Cl.
*G11C 7/00* (2006.01)
*G11C 29/00* (2006.01)

(52) U.S. Cl.
USPC .......................... 365/201; 365/154; 365/203

(58) Field of Classification Search
USPC ......................................... 365/154, 156, 201
See application file for complete search history.

(56) References Cited

U.S. PATENT DOCUMENTS

| | | | |
|---|---|---|---|
| 6,282,137 B1 | 8/2001 | Lee | |
| 6,346,825 B1 * | 2/2002 | Pang et al. | 326/40 |
| 6,347,058 B1 | 2/2002 | Houghton | |
| 6,469,950 B2 | 10/2002 | Itoh | |
| 6,597,610 B2 | 7/2003 | Houston | |
| 6,643,804 B1 * | 11/2003 | Aipperspach et al. | 714/718 |
| 6,687,175 B1 | 2/2004 | Mizuno | |
| 6,747,478 B2 * | 6/2004 | Madurawe | 326/39 |
| 6,862,227 B2 * | 3/2005 | Yamaoka et al. | 365/189.09 |
| 6,917,556 B2 | 7/2005 | Itoh | |
| 6,940,307 B1 | 9/2005 | Liu | |
| 6,984,564 B1 | 1/2006 | Huang | |
| 6,985,380 B2 | 1/2006 | Khellah | |
| 7,079,413 B2 * | 7/2006 | Tsukamoto et al. | 365/154 |
| 7,129,745 B2 * | 10/2006 | Lewis et al. | 326/38 |
| 7,173,875 B2 | 2/2007 | Chan | |
| 7,283,410 B2 * | 10/2007 | Hsu et al. | 365/201 |
| 7,301,797 B2 * | 11/2007 | Kimura | 365/154 |
| 7,324,391 B2 * | 1/2008 | Loh et al. | 365/201 |
| 7,333,357 B2 * | 2/2008 | Houston | 365/154 |
| 7,333,358 B2 | 2/2008 | Dirscherl | |
| 7,334,198 B2 * | 2/2008 | Ditzel et al. | 716/133 |
| 7,468,919 B2 * | 12/2008 | Sekar et al. | 365/185.27 |
| 7,508,697 B1 * | 3/2009 | Mukhopadhyay et al. | 365/154 |

(Continued)

OTHER PUBLICATIONS

Liu et al. U.S. Appl. No. 11/335,437, filed Jan. 28, 2006.

(Continued)

*Primary Examiner* — Harry W Byrne
*Assistant Examiner* — Lance Reidlinger
(74) *Attorney, Agent, or Firm* — Treyz Law Group; G. Victor Treyz; Jason Tsai

(57) ABSTRACT

Integrated circuits such as programmable logic device integrated circuits are provided that have memory arrays with memory cells arranged in rows and columns. Address lines may be associated with each row of memory cells and data lines may be associated with each column of memory cells. Precharge driver circuitry may be used to precharge the data lines to a precharge voltage prior to performing read operations. The integrated circuit may contain core logic that is powered using a core logic power supply voltage. The precharge voltage may be reduced with respect to the core logic power supply voltage. Each address transistor may have a body bias terminal. The integrated circuit may contain programmable voltage regulator circuitry that produces a body bias for the address transistors based on a body bias setting stored in nonvolatile memory on the integrated circuit.

17 Claims, 13 Drawing Sheets

(56) References Cited

U.S. PATENT DOCUMENTS

| | | | |
|---|---|---|---|
| 7,522,445 B2* | 4/2009 | Inaba | 365/154 |
| 7,532,501 B2* | 5/2009 | Joshi et al. | 365/154 |
| 7,542,360 B2* | 6/2009 | Rashed et al. | 365/201 |
| 7,596,013 B2* | 9/2009 | Yamaoka et al. | 365/154 |
| 7,924,640 B2* | 4/2011 | Deng et al. | 365/201 |
| 2004/0223386 A1* | 11/2004 | Mudge et al. | 365/202 |
| 2005/0041460 A1* | 2/2005 | Vinke et al. | 365/154 |
| 2005/0068824 A1* | 3/2005 | Houmura et al. | 365/202 |
| 2005/0201141 A1 | 9/2005 | Turner | |
| 2006/0227594 A1* | 10/2006 | Wang et al. | 365/154 |
| 2006/0274569 A1* | 12/2006 | Joshi et al. | 365/154 |
| 2009/0046519 A1* | 2/2009 | Wang et al. | 365/189.09 |
| 2010/0202192 A1* | 8/2010 | Elvira Villagra et al. | 365/154 |

OTHER PUBLICATIONS

Perisetty. U.S. Appl. No. 11/369,548, filed Mar. 6, 2006.
A. Bhavnagarwala et al., "Fluctuation Limits and Scaling Opportunities for CMOS SRAM Cells", IEEE 2005.
M. Yamaoka et al., "90-nm Process-Variation Adaptive Embedded SRAM Modules With Power-Line-Floating Write Technique", IEEE Journal of Solid-State Circuits, vol. 41, No. 3, Mar. 2006, pp. 705-711.

* cited by examiner

MEMORY ARRAY CIRCUITRY WITH STABILITY ENHANCEMENT FEATURES

This application is a division of patent application Ser. No. 11/711,969, filed Feb. 27, 2007, now abandoned which is hereby incorporated by reference herein in its entirety.

BACKGROUND

This invention relates to integrated circuits with memory cells, and more particularly, to circuitry for enhancing the stability of memory cell arrays.

Memory arrays are used in integrated circuits such as integrated circuit memories and programmable logic devices.

Programmable logic devices are a type of integrated circuit that can be programmed by a user to implement a desired custom logic function. In a typical scenario, a logic designer uses computer-aided design (CAD) tools to design a custom logic circuit. These tools help the designer to implement the custom logic circuit using the resources available on a given programmable logic device. When the design process is complete, the CAD tools generate configuration data files. The configuration data is loaded into programmable logic devices to configure them to perform the desired custom logic function.

Programmable logic devices contain programmable memory elements such as random-access-memory cells into which configuration data is loaded during device programming. Programmable logic devices also contain arrays of random-access-memory cells that are used for handling data that is being processed by circuitry on the devices during normal device operation.

Memory arrays are often used to store critical data. With conventional techniques, memory cell stability is ensured by adjusting transistor sizes. Redundant resources may also be provided so that defects can be repaired by switching redundant circuitry into use. Although these approaches are sometimes satisfactory, they can lead to undesirable overhead in an integrated circuit design.

It would therefore be desirable to be able to provide improved techniques to improve memory cell stability.

SUMMARY

In accordance with the present invention, memory arrays for integrated circuits such as programmable logic device integrated circuits are provided. The memory arrays have memory cells arranged in rows and columns. Address lines are associated with the rows of memory cells and data lines are associated with the columns of memory cells.

Precharging circuitry may be used to precharge the data lines to a positive precharge voltage level before performing read operations. The integrated circuit may have core logic that is powered at a core power supply voltage. The precharge voltage level may be less than the core power supply voltage.

The precharging circuitry may include multiple precharge drivers, each of which is associated with a respective one of the data lines. The precharge drivers may be based on n-channel metal-oxide-semiconductor transistors. There is a threshold voltage associated with each n-channel metal-oxide-semiconductor transistor. When n-channel metal-oxide-semiconductor transistors are used in the precharge drivers, the threshold voltage of the transistors reduces the magnitude of the voltage that is applied to the data lines, thereby ensuring that the precharge voltage is less than the core logic power supply voltage. The precharging circuitry may also include voltage regulator circuitry for reducing the magnitude of the precharge voltage.

Reducing the precharge voltage enhances memory cell stability. Memory cell stability may also be enhanced by making body bias adjustments. The memory cells include address transistors that are controlled by address signals on the address lines. The address transistors include body bias terminals. By changing the body bias that is applied to the body bias terminals, the threshold voltage of the address transistors can be adjusted. During manufacturing, the memory cells can be tested to determine the body bias levels that are associated with read failures and write failures. An optimum body bias voltage that enhances memory cell stability may be selected based on these test results. Nonvolatile memory may be loaded with an optimum body bias setting. A programmable voltage regulator may be used to produce a desired address transistor body bias based on the optimum body bias setting stored in the nonvolatile memory.

Further features of the invention, its nature and various advantages will be more apparent from the accompanying drawings and the following detailed description of the preferred embodiments.

DETAILED DESCRIPTION

The present invention relates to memory cell circuitry. Memory cells are typically arranged in arrays. Some memory arrays are used to store configuration data in programmable logic devices. Memory cells of this type that are based on random-access-memory designs are sometimes referred to as configuration random-access-memory (CRAM) cells. Arrays of random-access-memory cells are also used as on-chip memory for processing circuitry on a programmable logic device. Memory arrays of this type are sometimes referred to as memory blocks.

Memory arrays may be part of any suitable integrated circuits, such as application specific integrated circuits (e.g., video application specific integrated circuits), electrically programmable and mask-programmable programmable logic device integrated circuits, digital signal processors, microprocessors, microcontrollers, and memory chips. If desired, memory arrays may be used in programmable integrated circuits that are not traditionally referred to as programmable logic devices such as microprocessors containing programmable logic, digital signal processors containing programmable logic, custom integrated circuits containing regions of programmable logic, or other programmable integrated circuits that contain programmable logic and one or more memory blocks.

The present invention is sometimes described herein in connection with memory arrays on programmable logic device integrated circuits. This is, however, merely illustrative. The memory cell circuitry may be used in connection with memory cell arrays on any suitable integrated circuit if desired.

Figure 1:
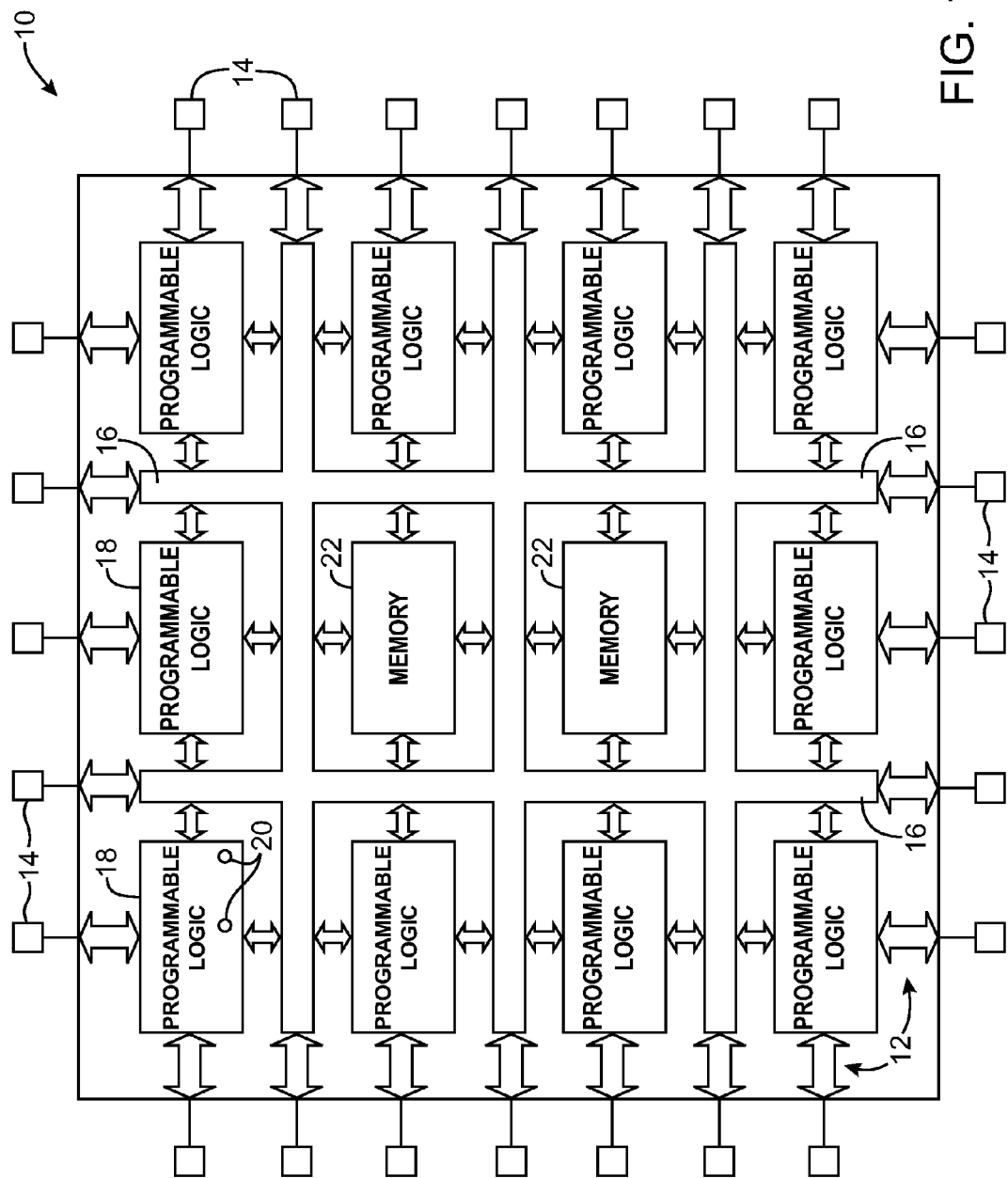
FIG. 1 is a diagram of an illustrative programmable logic device integrated circuit in accordance with an embodiment of the present invention.

An illustrative programmable logic device 10 in accordance with the present invention is shown in FIG. 1.

Programmable logic device 10 has input/output circuitry 12 for driving signals off of device 10 and for receiving signals from other devices via input/output pins 14. Interconnection resources 16 such as global and local vertical and horizontal conductive lines and busses may be used to route signals on device 10. Interconnection resources 16 include conductive lines and programmable connections between respective conductive lines and are therefore sometimes referred to as programmable interconnects 16.

Programmable logic device 10 contains programmable logic 18 and memory blocks 22.

Programmable logic 18 may include combinational and sequential logic circuitry. The programmable logic 18 may be configured to perform a custom logic function. The programmable interconnects 16 may be considered to be a type of programmable logic 18.

Programmable logic device 10 contains programmable memory elements 20. Memory elements 20 can be loaded with configuration data (also called programming data) using pins 14 and input/output circuitry 12. Once loaded, the memory elements each provide a corresponding static control output signal that controls the state of an associated logic component in programmable logic 18. Memory elements 20 may use any suitable volatile and/or non-volatile memory structures such as random-access-memory (RAM) cells, fuses, antifuses, programmable read-only-memory memory cells, mask-programmed and laser-programmed structures, etc. Because memory elements 20 are loaded with configuration data during programming, memory elements 20 are sometimes referred to as configuration memory or configuration RAM. Mask-programmed programmable logic devices, which are sometimes referred to as structured application specific integrated circuits, are programmed by using lithographic masks to create a custom pattern of connections in an array of vias based on configuration data.

Memory arrays 22 contain rows and columns of volatile memory elements such as random-access-memory (RAM) cells. The memory arrays 22 are used to store data signals during normal operation of device 10. The memory arrays 22 need not all be the same size. For example, small, medium, and large memory arrays 22 may be included on the same programmable logic device. There may, for example, be hundreds of small memory arrays each having a capacity of about 512 bits, 2-9 large memory arrays each having a capacity of about half of a megabit, and an intermediate number of medium size memory arrays each having a capacity of about 4 kilobits. These are merely illustrative memory array sizes and quantities. In general, there may be any suitable size and number of memory arrays 22 on device 10. There may also be any suitable number of regions of programmable logic 18.

To support normal use in a system, memory elements 20 are generally loaded with configuration data from a configuration device integrated circuit via pins 14 and input/output circuitry 12. The outputs of the loaded memory elements 20 are applied to the gates of metal-oxide-semiconductor transistors in programmable logic 18 to turn certain transistors on or off and thereby configure the logic in programmable logic 18. Programmable logic circuit elements that may be controlled in this way include pass gates, look-up tables, logic arrays, AND, OR, NAND, and NOR logic gates, etc.

The circuitry of device 10 may be organized using any suitable architecture. As an example, the logic of programmable logic device 10 may be organized in a series of rows and columns of larger programmable logic regions each of which contains multiple smaller logic regions. The resources of device 10 such as programmable logic 18 and memory 22 may be interconnected by programmable interconnects 16. Interconnects 16 generally include vertical and horizontal conductors. These conductors may include global conductive lines that span substantially all of device 10, fractional lines such as half-lines or quarter lines that span part of device 10, staggered lines of a particular length (e.g., sufficient to interconnect several logic areas), smaller local lines, or any other suitable interconnection resource arrangement. If desired, the logic of device 10 may be arranged in more levels or layers in which multiple large regions are interconnected to form still larger portions of logic. Still other device arrangements may use logic that is not arranged in rows and columns.

In addition to the relatively large blocks of programmable logic that are shown in FIG. 1, the device 10 generally also includes some programmable logic associated with the programmable interconnects, memory, and input-output circuitry on device 10. For example, input-output circuitry 12 may contain programmable input and output buffers. Interconnects 16 may be programmed to route signals to a desired destination.

Figure 2:
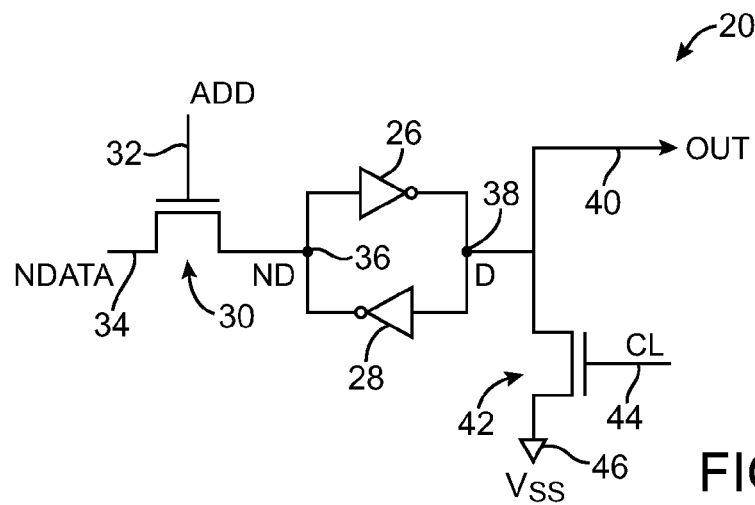
FIG. 2 is a diagram of an illustrative programmable memory element formed from a random-access-memory cell in accordance with an embodiment of the present invention.

An illustrative programmable element 20 that is based on a configuration random-access-memory cell is shown in FIG. 2. As shown in FIG. 2, element 20 is based on two cross-coupled inverters 26 and 28. Data D is stored in element 20 on node 38. If D is high, element 20 is said to be storing a logic one. If D is low, element 20 is said to be storing a logic zero. The inverse of data D (signal ND) is present on node 36.

During normal operation of element 20, element 20 is loaded with configuration data. If the loaded value of the configuration data is a logic one, a high voltage is provided at output terminal 40. If the loaded value of the configuration data is a logic zero, a low voltage is provided at output terminal 40. The signal on output terminal 40 is applied to programmable logic 18 such as the gate of a transistor.

During device programming, data may be loaded into element 20 via data lines (sometimes referred to as bit lines). Individual cells in an array are addressed using address lines (sometimes referred to as word lines). In the example of FIG. 2, element 20 has an address transistor 30 that is connected between data line 34 and node 36. The gate of address transistor 30 receives an address signal from address line 32. When it is desired to write a data bit into element 20, address line 32 is asserted, turning re-channel metal-oxide-semiconductor transistor 30 on and connecting node 36 to data line 34. Data may be read from element 20 (e.g., for testing). During read operations, data line 34 is precharged using precharge circuitry. Following precharge operations, address line 32 is asserted, so that the value of ND may be sensed by sense amplifier circuitry that is connected to data line 34.

Clear transistor 42 may be used to clear an array of memory elements 20. When clear line 44 is asserted, transistor 42 is turned on and node 38 is connected to ground voltage Vss at ground terminal 46.

Memory elements of the type shown in FIG. 2 are typically fabricated on an integrated circuit in close proximity to programmable logic components. Robust cell designs are typically used to guard against proximity effects. Moreover, because there is a load imposed on elements 20 due to the logic connected to output lines 40, elements 20 may be constructed using relatively large transistors.

Figure 3:
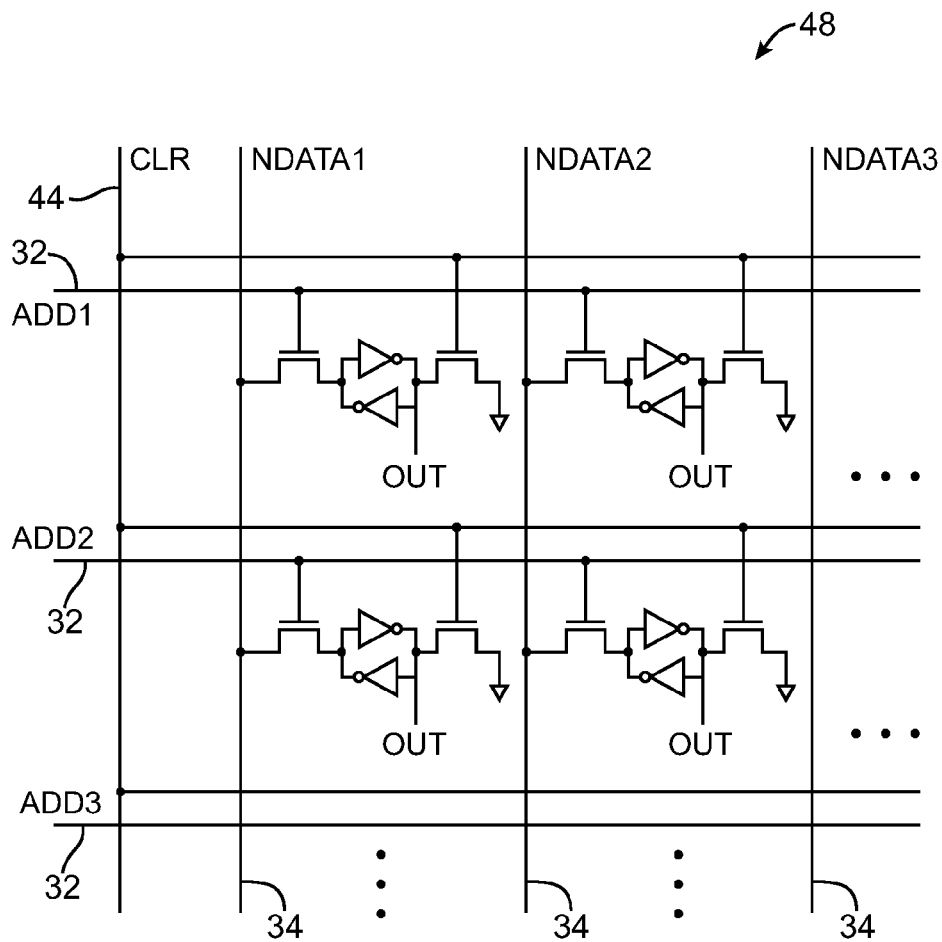
FIG. 3 is a diagram of an illustrative array of programmable memory elements formed from random-access-memory cells in accordance with an embodiment of the present invention.

FIG. 3 shows how programmable memory element cells of the type shown in FIG. 2 may be organized in an array 48 on an integrated circuit.

Figure 4:
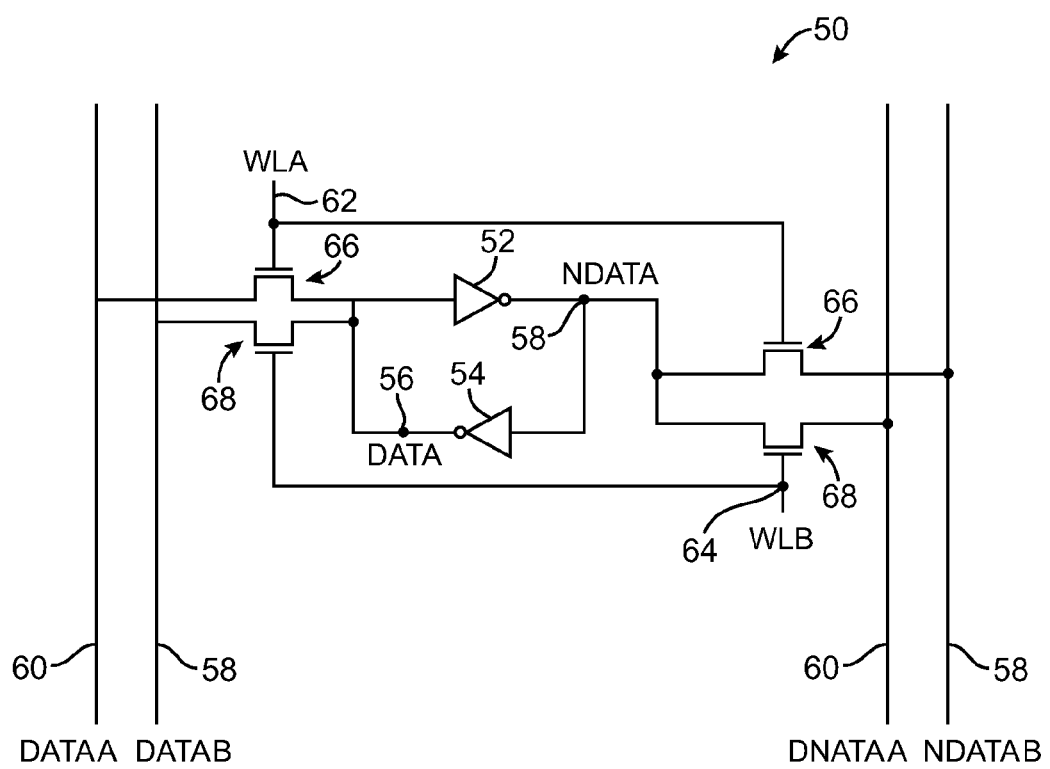
FIG. 4 is a diagram of an illustrative dual port random-access-memory cell in accordance with an embodiment of the present invention.

Memory arrays 22 (FIG. 1) may be formed from dual-port memory cells or single-port memory cells. An illustrative dual-port memory cell 50 is shown in FIG. 4. As shown in FIG. 4, memory cell 50 has cross-coupled inverters 52 and 54. A data signal DATA is stored on data node 56. An inverse data signal NDATA is stored on node 58.

Data may be read from cell 50 and may be written into cell 50 using two ports (i.e., port A and port B). In the arrangement of FIG. 4, there are two data lines 60 (true and complement) associated with port A and two data lines 58 associated with port B. Address line 62 is associated with port A and address line 64 is associated with port B. Address line 62 controls address transistors 66 and may be asserted when it is desired to access cell 50 using data lines 60. Address line 64 controls address transistors 68 and may be asserted when it is desired to access cell 50 using data lines 58.

Figure 5:
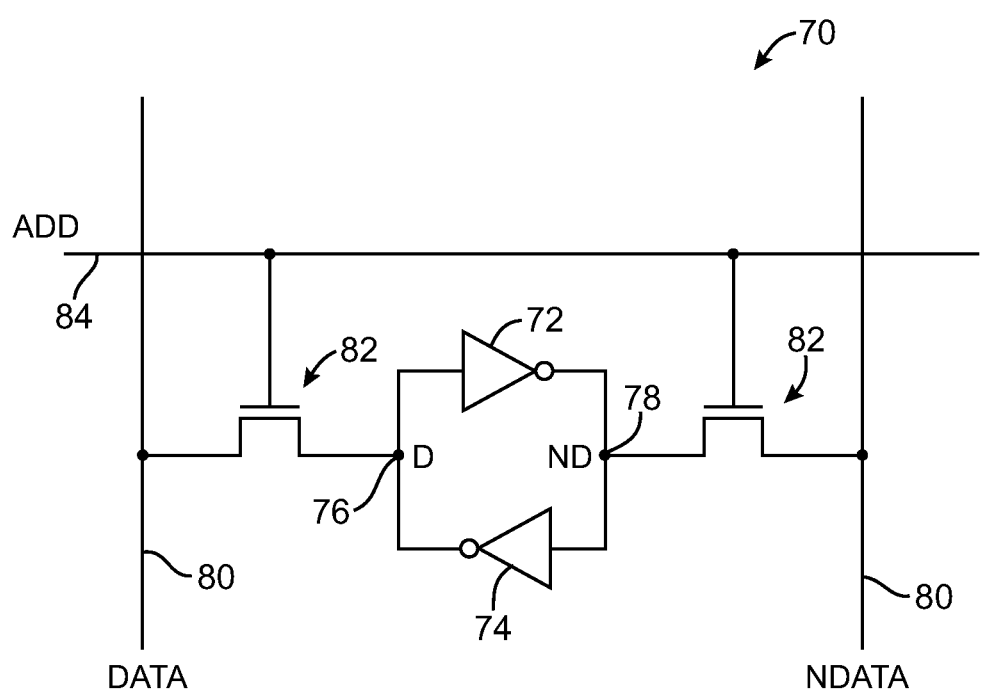
FIG. 5 is a diagram of an illustrative single-port random-access-memory cell in accordance with an embodiment of the present invention.

An illustrative single-port memory cell 70 is shown in FIG. 5. Memory cell 70 has cross-coupled inverters 72 and 74. Data signal D is stored on node 76. Its inverse (data signal ND) is stored on node 78. Data may be written into cell 70 and read from cell 70 using data lines 80. Address transistors 82 are controlled by address line 84. When address line 84 is asserted, transistors 82 are turned on and data lines 80 are connected to nodes 76 and 78, respectively.

The memory cell circuitry of the present invention may be used with any suitable memory cells such as configuration random-access-memory cells, dual-port memory cells, or single-port memory cells. The memory cell circuitry may sometimes be described in the connection with a single-port memory cell arrangement of the type shown in FIG. 5. This is, however, merely illustrative.

Figure 6:
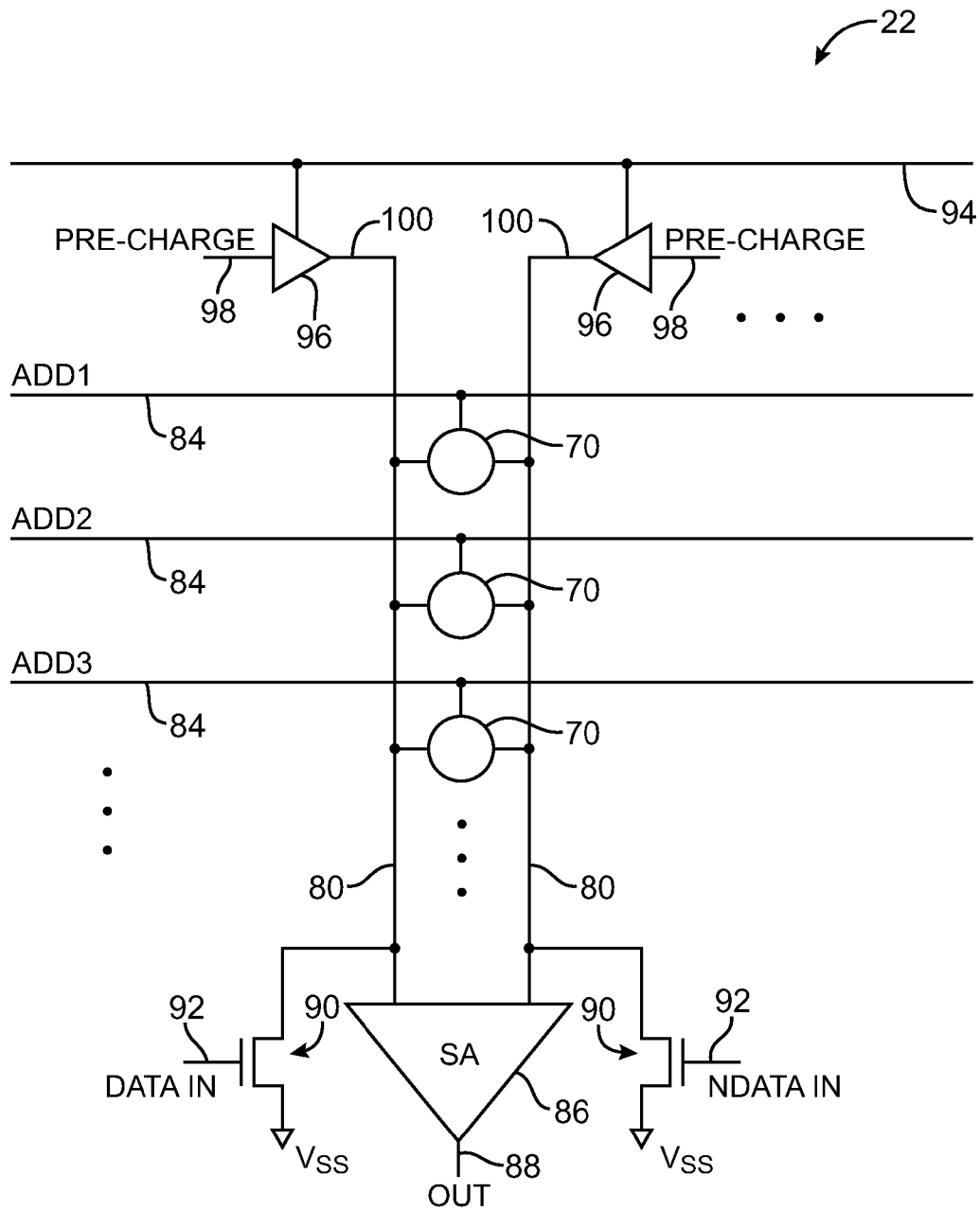
FIG. 6 is a diagram of an illustrative memory array formed from random-access-memory cells of the type shown in FIG. 5 in accordance with an embodiment of the present invention.

As shown in FIG. 6, memory cells 70 may be arranged in an array 22 having rows that are addressed by respective address lines 84 and columns that have associated data lines 80.

During write operations, write transistors 90 may be selectively controlled by data signals DATAIN and NDATAIN on the control lines 92. Write transistors 90 selectively couple data lines 80 to ground Vss. The left-hand transistor 90 can be turned on when it is desired to write a logic one. The right-hand transistor 90 can be turned on when it is desired to write a logic zero.

The illustrative arrangement of FIG. 6 uses a differential read scheme in which true and complement data lines 80 are connected to sense amplifier 86. During read operations, sense amplifier 86 converts differential signals on lines 80 into a single-ended data signal on output line 88.

Precharge drivers 96 are used to precharge data lines 80 to a positive voltage prior to read operations. In accordance with one aspect of the invention, the precharge voltage may be reduced relative to the normal positive power supply voltage that is used to power the logic on device 10. For example, if device 10 has an associated core logic power supply voltage Vcc of 0.9 volts (as an example) that is used to power logic on device 10 and the cross-coupled inverters in the memory cells, the precharge voltage on lines 80 may be about 0.6 volts (as an example). Reducing the precharge voltage on data lines 80 in effect weakens the associated address transistors 82 (FIG. 5) in each memory cell 70, which can improve memory cell stability.

Precharge drivers 96 may be powered with a positive power supply voltage on line 94 and may be controlled by precharge control signals PRECHARGE on lines 98. During precharge operations, a precharge voltage is applied to lines 80 from precharge driver outputs 100. The precharge voltage may, if desired, be less than a core logic power supply voltage Vcc that is being used to power cells 70 and programmable logic 18.

Precharging is generally necessary because inverters 72 and 74 are formed using complementary metal-oxide-semiconductor (CMOS) transistors.

Figure 7:
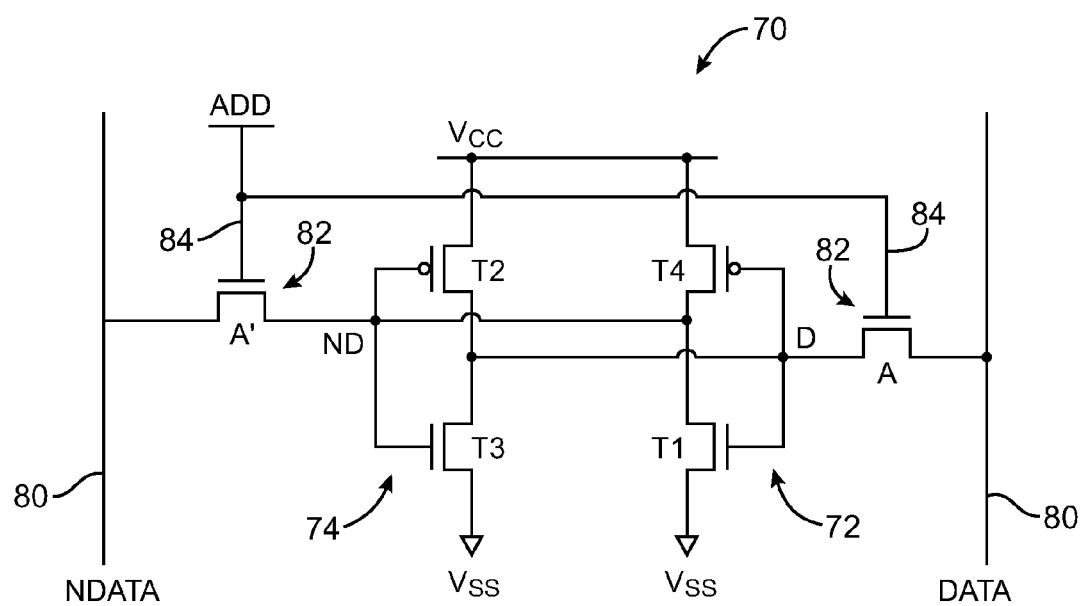
FIG. 7 is a diagram of an illustrative random-access-memory cell formed from complementary metal-oxide-semiconductor (CMOS) transistor inverters in accordance with an embodiment of the present invention.

An illustrative memory cell 70 that is based on CMOS inverters 72 and 74 is shown in FIG. 7. Inverter 72 has p-channel metal-oxide-semiconductor (PMOS) transistor T4 and n-channel metal-oxide-semiconductor (NMOS) transistor T1. Inverter 74 has PMOS transistor T2 and NMOS transistor T3. The strength of PMOS transistors T2 and T4 is generally less than the strength of NMOS transistors T1 and T3 (i.e., about half strength). It is therefore desirable to precharge the data lines 80. This assists the PMOS transistors during read operations.

Consider, as an example, the situation in which data signal D is high. In this configuration, transistor T1 is on, signal ND is low, and transistor T2 is on. To read data from cell 70, address line 84 has been taken high, turning on transistors 82. If data lines 80 were not precharged properly and a data line 80 happens to have drifted to a low voltage prior to assertion of the address line 84, there may be an excessively long time before transistor T2 is able to bring the data line high during a read operation. This is because transistor T2 is a relatively weak PMOS transistor. This problem can be addressed by precharging the data line to a high voltage, so that the weak PMOS transistor is not forced to drive the data line high.

Even with precharging in place, it is still possible to satisfactorily read logic zeros from cell 70. Consider, as an example, the situation in which data signal D is low. In this scenario, signal ND is high and, due to precharging, the data lines are high. During a read operation, transistor T3 is on, because signal ND is high. With transistor T3 on, data signal D is pulled low to Vss (e.g., 0 volts). Transistor T3 is a relatively strong NMOS transistor and is therefore able to handle this switching operation in a reasonable amount of time. Note that signal ND is high and, due to the precharge operation, NDATA is high, so that during the read operation signal ND is unchanged.

Conventional precharge drivers use PMOS transistors to deliver the full core logic power supply voltage Vcc to the data lines during precharge operations. PMOS transistors deliver the full voltage Vcc to the data lines without imposing a threshold voltage drop, which, in the conventional view, is seen as advantageous because a voltage drop would reduce precharge effectiveness.

However, memory cell sizes are continually being reduced due to advances in semiconductor manufacturing technology. Particularly at small cell sizes, a conventional full precharge signal on the data lines may be disadvantageous. This is because it can be difficult for the NMOS memory cell transistors such as transistor T3 of FIG. 7 to pull overly-charged data lines low when the address line has been asserted and transistor T3 is driving a parasitic load associated with data line 80. With small cell sizes, cells may fail due to inadequate T3 performance, rather than inadequate T2 performance.

It may therefore be desirable to apply a reduced precharge voltage during precharge operations. A reduced precharge voltage may be used that is low enough to help NMOS transistor T3 pull data line 80 low, without being so low that the precharge assistance for weak PMOS transistor T2 is lost.

Figure 8:
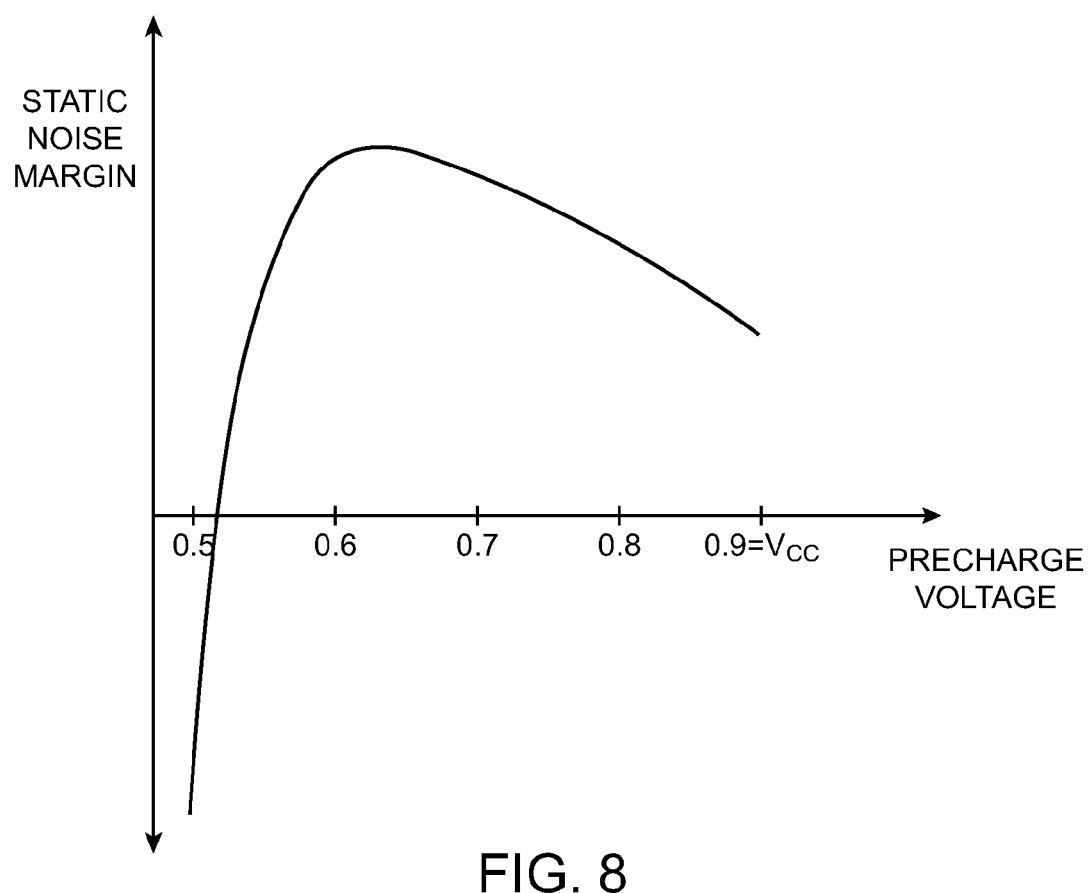
FIG. 8 is a graph illustrating how static noise margin for a cell of the type shown in FIG. 7 varies as a function of data line precharge voltage in accordance with an embodiment of the present invention.

A graph of a simulation that has been performed to identify an optimum precharge voltage for an illustrative memory cell 70 is shown in FIG. 8. This example applies to a particular device geometry and an illustrative positive power supply voltage of Vcc=0.9 V. The optimal precharge voltage that is used for a given circuit will generally depend on a number of factors, including device geometry, parasitic loads, etc.

As shown in the graph of FIG. 8, static noise margin for the memory cell is maximized when a precharge voltage of about 0.6 volts is used (i.e., 0.3 volts less than Vcc).

Any suitable arrangement may be used to apply the reduced precharge voltage to the data lines. Three illustrative precharge circuits are shown in FIGS. 9, 10, and 11.

Figure 9:
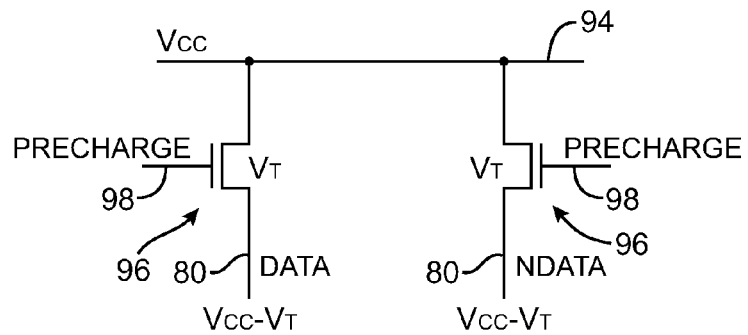
FIG. 9 is a diagram of illustrative precharge driver circuitry based on n-channel metal-oxide-semiconductor transistors in accordance with an embodiment of the present invention.

As shown in FIG. 9, precharge drivers 96 may be based on NMOS transistors having an associated threshold voltage Vt. The NMOS transistors may be fabricated with a Vt value that is appropriate to reduce Vcc to the optimum precharge voltage. For example, if the optimum precharge voltage for maximum cell stability is determined to be 0.6 volts and Vcc is 0.9 volts, the NMOS transistors may be fabricated so that their threshold voltage Vt is 0.3 volts (as an example).

Due to the use of the NMOS transistors for precharge drivers 96 of FIG. 9, the power supply voltage Vcc (i.e., a nominal conventional precharge voltage that is equal to the core power supply voltage) is reduced to Vcc−Vt on data lines 80 during precharge operations.

Figure 10:
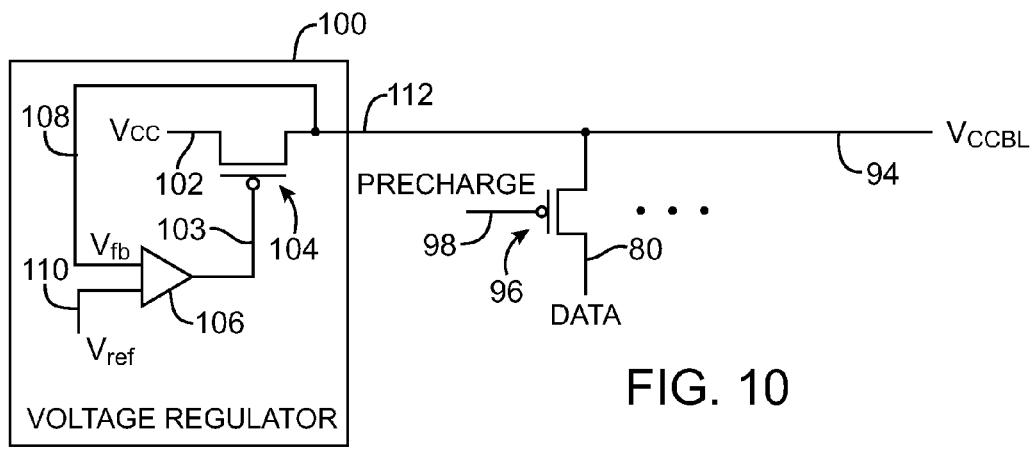
FIG. 10 is a diagram of an illustrative voltage regulator circuit that may be used to adjust data line precharge voltages in accordance with an embodiment of the present invention.
Figure 11:
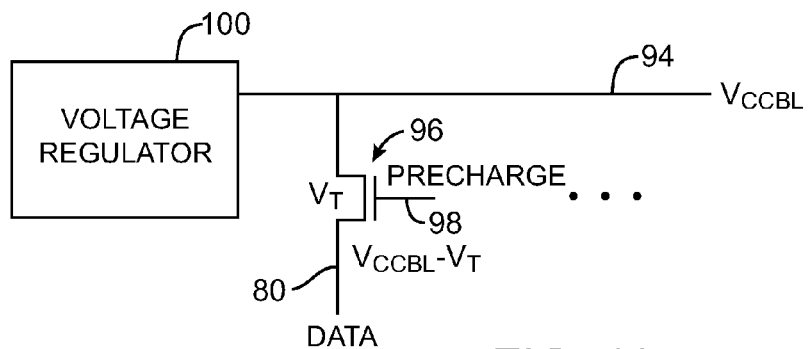
FIG. 11 is a diagram of an illustrative hybrid data line precharge circuit that uses a voltage regulator of the type shown in FIG. 10 and n-channel metal-oxide-semiconductor precharge transistors of the type shown in FIG. 9 in accordance with an embodiment of the present invention.

Another way in which to reduce the magnitude of the precharge voltage is shown in FIG. 10. The circuitry of FIG. 10 has a voltage regulator 100. Voltage regulator 100 receives a positive power supply voltage (i.e., the core logic power supply voltage) Vcc on terminal 102. The voltage on terminal 102 is regulated using PMOS control transistor 104. Comparator 106 compares a feedback signal Vfb from output 112 on feedback line 108 to a reference voltage Vref that is received on input line 110 and produces a corresponding control signal on line 103. When the signal on line 103 goes high, the voltage on voltage regulator output 112 is reduced. When the signal on line 103 goes low, the voltage on voltage regulator output 112 is increased. By proper selection of the reference voltage (e.g., using a fixed or programmable voltage reference), the precharge power supply voltage Vccbl on line 94 can be reduced (e.g., to 0.6 volts from a Vcc value on line 102 of 0.9 volts). PMOS-based precharge drivers 96 may then be used to precharge data lines 80 using the reduced precharge voltage on line 94.

If desired, a hybrid circuit may be used as shown in FIG. 11. In the example of FIG. 11, NMOS precharge drivers 96 of the type described in connection with FIG. 9 are being used in conjunction with a voltage regulator that reduces the precharge power supply line 94 from Vcc to Vccbl as described in connection with FIG. 10.

Figure 12:
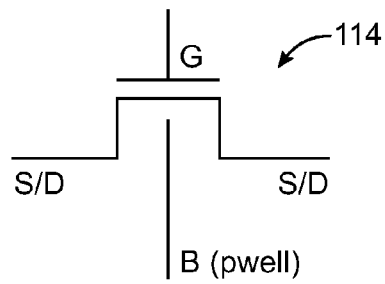
FIG. 12 is a diagram of an illustrative n-channel metal-oxide-semiconductor transistor having a body bias terminal in accordance with an embodiment of the present invention.
Figure 13:
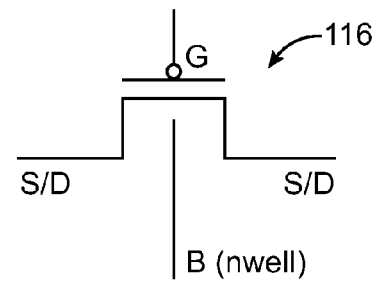
FIG. 13 is a diagram of an illustrative p-channel metal-oxide-semiconductor transistor having a body bias terminal in accordance with an embodiment of the present invention.
Figure 14:
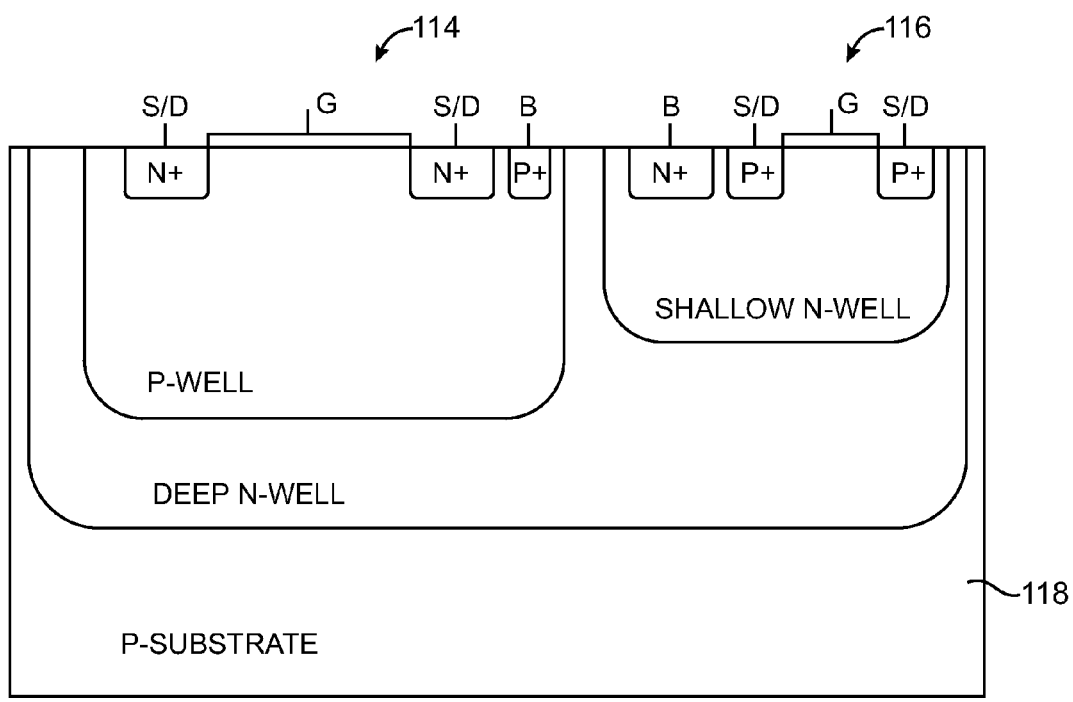
FIG. 14 is a cross-sectional side view of an illustrative n-channel and p-channel metal-oxide-semiconductor transistors showing the locations of the body bias terminals of FIGS. 12 and 13 in accordance with an embodiment of the present invention.

In addition to, or as an alternative to improving memory cell stability during read operations using reduced precharge voltages, memory cell stability may be enhanced by manipulating the body bias voltage of the memory cell address transistors. As shown by illustrative NMOS transistor 114 in FIG. 12, NMOS transistors have four terminals: a gate terminal G, a body terminal B (also sometimes referred to as a well terminal or pwell), a source terminal, and a drain terminal. The source and drain are sometimes collectively referred to as source-drain terminals and are labeled S/D in the drawings. A PMOS transistor 116 with a body bias terminal (nwell) is shown in FIG. 13. FIG. 14 is a cross-sectional view of an NMOS transistor 114 and PMOS transistor 116 constructed on a common substrate 118.

In a typical integrated circuit, the pwells of NMOS transistors are biased negatively and the nwells of PMOS transistors are biased positively to increase their respective threshold voltages to reduce leakage current and thereby reduce power consumption (e.g., in standard CMOS inverters).

In accordance with the present invention, the body bias terminals B associated with the memory cell address transistors (i.e., the pwell of address transistors 82 of FIG. 7) are biased at an optimum voltage to ensure that the memory cell 70 has maximum stability. In particular, the body bias voltage may be selected so that node ND is not erroneously flipped by application of the precharge voltage when A' goes high during a read when a logic one is stored on node D and a logic zero is present on node ND.

Consider the situation in which a logic one is stored on node D of memory cell 70 of FIG. 7. In this situation, node ND is low. During precharge operations, just prior to a data read operation, data lines DATA and NDATA are taken high to a precharge voltage. If address transistor A' is too strong, the high precharge voltage that is present on line NDATA may be driven into cell 70 and may flip the state of node ND from low to high, thereby corrupting the contents of cell 70. By lowering the body bias voltage on the body terminal of address transistor A' (or the comparable address transistors in cells 20 and 50 of FIGS. 2 and 4), transistor A' is weakened sufficiently to avoid this type of error.

Due to process variations during the fabrication of an integrated circuit, address transistors such as address transistor A' may sometimes be too weak to overcome the inverter transistors of cell 70 (i.e., when writing a logic zero onto node D or ND). In this situation, the PMOS transistors in the inverters that are trying to pull the memory cell nodes D/ND high are stronger than the address transistors. If this occurs, the address transistors may be strengthened by lowering their threshold voltage Vt by adjusting their body bias voltage to a positive voltage.

Figure 15:
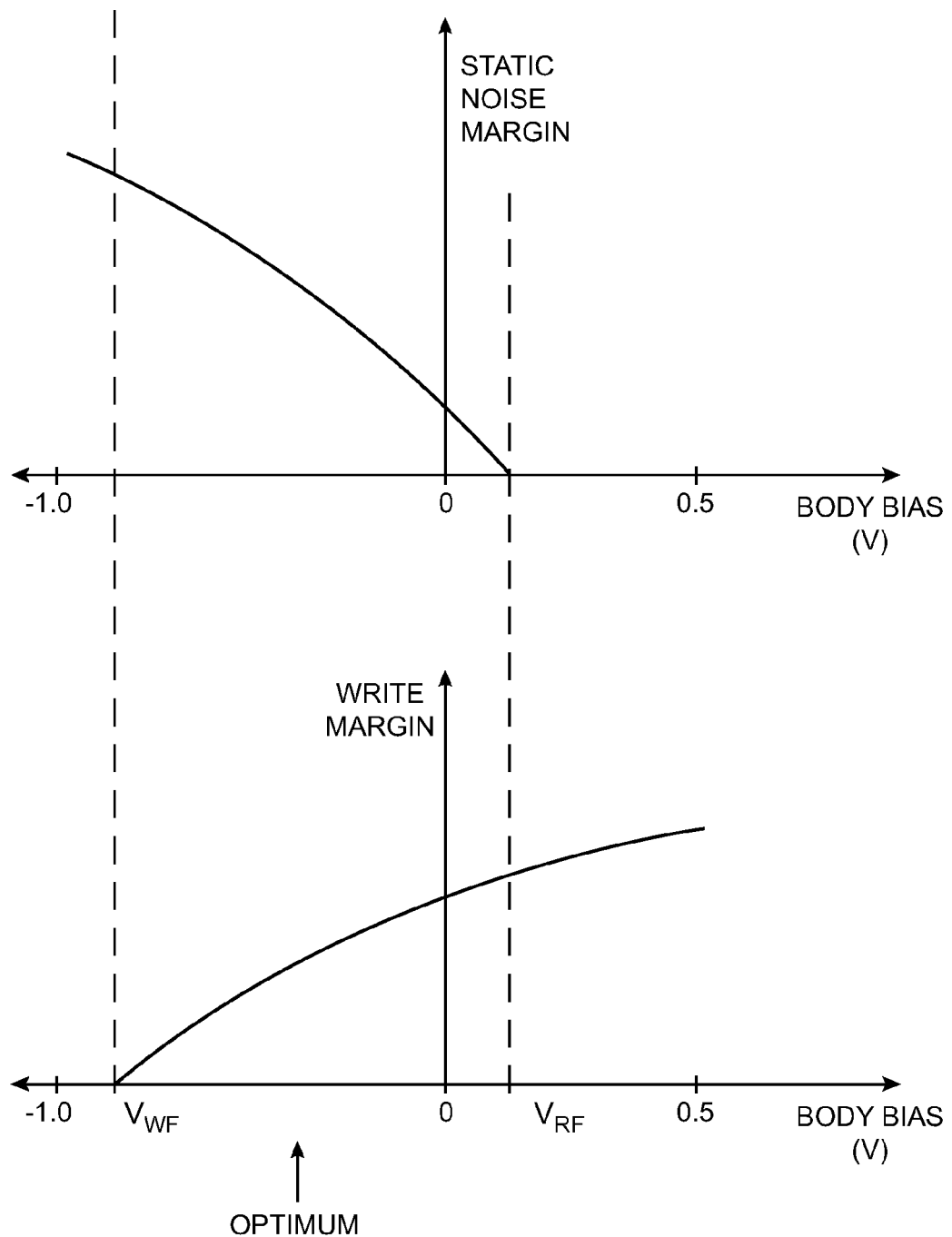
FIG. 15 contains graphs of static noise margin and write margin for an illustrative memory cell plotted as a function of address transistor body bias voltage in accordance with an embodiment of the present invention.

FIG. 15 shows simulated static noise margin and write margin results for a typical memory cell as a function of address transistor body bias.

As shown in the upper trace of FIG. 15, at large negative body bias voltages (e.g., −1.0 volts), the static noise margin of the cell is high. In this situation, the threshold voltage of the address transistor is high. With a high threshold voltage, the address transistor is weak and the cell is unlikely to be erroneously flipped during a read operation. At more positive body bias voltages, the threshold voltage of the address transistor is lowered and the transistor is strengthened. As the body bias increases, the static noise margin decreases until, at Vrf, the static noise margin reaches zero. At body bias voltages above Vrf, the state of the cell will be flipped during read operations. The voltage Vrf therefore represents an upper bound on the acceptable body bias voltages for the cell. Body biases above Vrf are unacceptable, because the cell will not be stable during read operations. As shown in FIG. 15, the value of Vrf may be greater than zero.

The lower trace of FIG. 15 shows how the write margin of the memory cell becomes increasingly small as the body bias voltage is decreased. As the body bias is decreased, the address transistor is weakened and is less likely to be able to successfully write a data bit into the memory cell. Once the body bias reaches the voltage Vwf, the write margin is zero. The voltage Vwf therefore represents a lower bound on the acceptable body bias voltage for the cell. At body bias voltages that are more negative than Vwf, the address transistor will be too weak to operate properly.

The optimum body bias for the address transistor lies in the range from Vwf and Vrf. For example, a body bias that lies approximately midway between Vwf and Vrf may be optimal. If a body bias value too near Vrf is used, the cell may be subject to read failures. If a body bias value too near Vwf is used, the cell may be subject to write failures.

As part of the process of manufacturing device 10, body bias testing may be performed to identify the body bias value at which read failures occur (i.e., Vrf) and/or the body bias value at which write failures occur (i.e., Vwf). An optimum body bias may then be identified (e.g., by averaging Vrf and Vwf). Non-volatile memory on the device 10 may be used to store the optimum body bias setting. When the device 10 is used in a system during normal operation, the stored body bias setting directs on-board circuitry to generate and apply the appropriate body bias to the address transistors of the memory cells in the device, thereby ensuring that the memory arrays on the device perform optimally.

Figure 16:
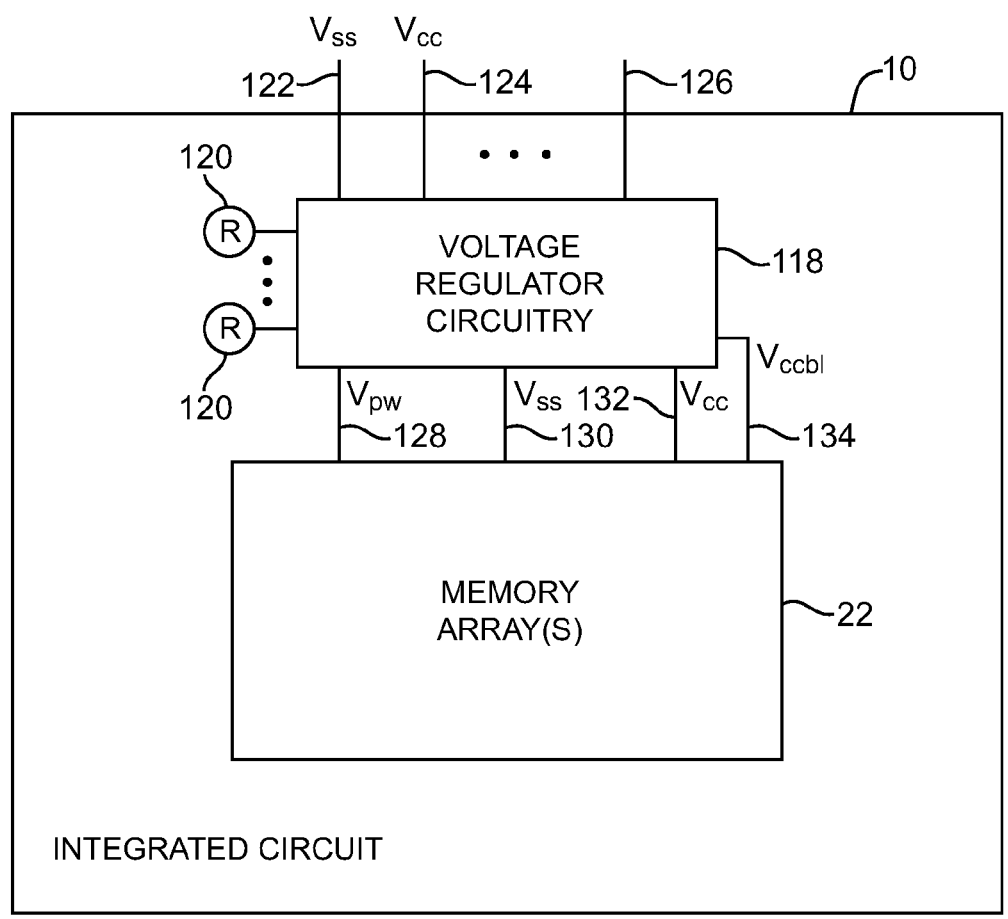
FIG. 16 is a diagram of an illustrative integrated circuit with body bias adjustment circuitry for enhancing memory cell stability in accordance with the present invention.

Programmable voltage regulator circuitry may be used to generate the desired body bias voltage. An illustrative integrated circuit 10 that contains programmable voltage regulator circuitry is shown in FIG. 16. As shown in FIG. 16, integrated circuit 10 may contain one or more memory arrays 22 and voltage regulator circuitry 118. Voltage regulator circuitry 118 may receive control signals from nonvolatile memory 120. Memory 120 may be formed from any suitable memory devices such as programmable antifuses, programmable fuses, electrically-erasable programmable read-only (EEPROM) memory devices, gate-oxide-based one-time programmable fuses, polysilicon fuses, laser-programmed fuses, etc. During device manufacturing, a desired optimum setting for the address transistors in memory arrays 22 is stored in nonvolatile memory 120. This stored information controls voltage regulator 118.

Voltage regulator 118 may receive power supply voltages such as a ground power supply voltage Vss (e.g., 0 volts), a positive power supply voltage Vcc (e.g., 0.9 volts) and other externally-supplied power supply voltages (e.g., positive and/or negative power supply voltages). Ground voltage Vss may be received using pin 122. Positive power supply voltage Vcc (which may be a core logic power supply voltage) may be received using pin 124. Pins such as pin 126 may be used to received additional power supply voltages. Voltage regulator circuitry 118 may include charge pump circuitry to generate negative body bias voltages (e.g., a negative voltage for an address transistor body bias voltage) based on the positive power supply voltage Vcc and the ground voltage Vss (i.e., if no negative power supply voltage is supplied from an external source). If a negative power supply voltage is received from an external source, voltage regulator circuitry 118 may be used to adjust the value of the received negative power supply voltage to generate a desired negative body bias voltage. Positive body bias voltages may be produced from positive power supply voltage Vcc.

Voltage regulator circuitry 118 may produce output voltages such as Vpw on line 128, Vss on line 130, Vcc on line 132, and Vccbl on line 134. Output voltage Vpw may be a pwell body bias voltage for the NMOS address transistors in memory arrays 22. The value of Vpw may be adjusted by selecting an optimum body bias setting and storing this setting in memory 120. Ground voltage Vss (e.g., 0 volts) may be applied to the ground terminals in memory arrays 22. One or more positive power supply voltages may be provided to memory arrays 22. For example, a positive power supply voltage Vcc (e.g., a core logic power supply voltage) may be supplied to the inverters of the memory cells in arrays 22. The positive power supply voltage may also be used in forming a precharge voltage. If desired, precharge voltage reduction techniques of the type described in connection with FIGS. 9, 10, and 11 may be used for arrays 22. For example, voltage regulator circuitry 118 may supply a reduced-voltage power supply voltage Vccbl on line 134 that is used for precharging the cells in arrays 22.

Figure 17:
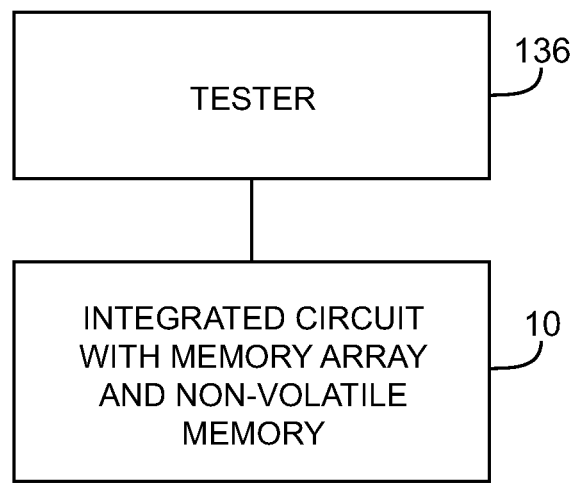
FIG. 17 is a diagram of a system environment in which an integrated circuit with memory cells may be tested during manufacturing to determine optimum address transistor body bias settings in accordance with an embodiment of the present invention.

As shown in FIG. 17, integrated circuit 10 may be connected to a tester 136 during testing (e.g., using a suitable test fixture). Tester 136 may apply test vectors to device 10 to test the logic and memory arrays 22 of device 10. If integrated circuit 10 is a programmable logic device integrated circuit 10, tester 136 may apply test configuration data to device 10. The memory tests that are performed on device 10 subject the memory arrays 22 on device 10 to at-speed read and write tests. These tests typically involve applying numerous patterns of repeated reads and writes (i.e., writes of ones followed by reads, writes of zeros followed by reads, etc.). The tester can gather information on read and write failures and corresponding body bias voltages. When read and write failures are detected at certain body bias voltages, the tester can ascertain the values of Vrf and Vwf. An optimum address transistor body bias voltage may then be programmed into memory 120 (FIG. 16) to ensure that the memory arrays 22 on device 10 will exhibit stable operation.

Figure 18:
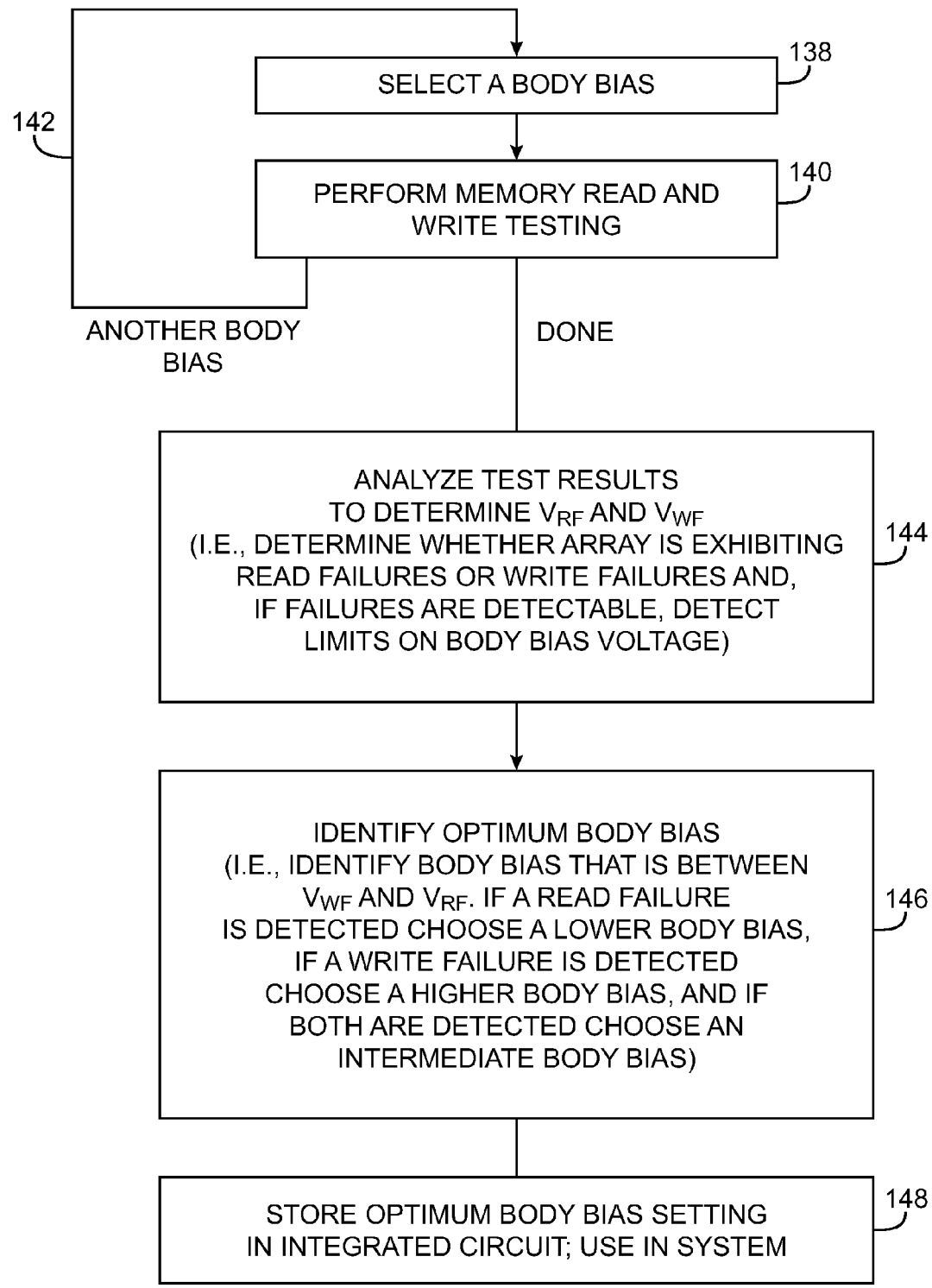
FIG. 18 is a flow chart of illustrative steps involved in identifying and using optimum memory cell address transistor body bias settings in accordance with an embodiment of the present invention.

A flow chart of illustrative steps involved in adjusting address transistor body bias settings to enhance device stability are shown in FIG. 18.

At step 138, tester 136 (FIG. 17) selects a given body bias and applies the body bias signal to the address transistors of memory arrays 22. During testing, tester 136 may send control signals to voltage regulator circuitry 118 that direct voltage regulator circuitry to generate a suitable body bias such as voltage Vpw on line 128. If memory 120 is erasable, tester 136 may load suitable test settings into memory 120 to adjust the body bias that is produced. Body bias signals may also be applied from the tester or other external sources.

At step 140, tester 136 performs read and write tests on memory arrays 22 in an attempt to detect read failures and write failures. Tester 136 may gather information on failure types and associated body bias voltages.

If more body bias voltages are to be tested, processing loops back to step 138, as indicated by line 142. If a sufficient range of body biases has been tested, the test results can be analyzed at step 144. Test results may be analyzed using tester 136 or any suitable computer equipment (e.g., one or more personal computers or workstations, etc.). During the analysis operations of step 144, it is determined whether the tested memory arrays are exhibiting any read or write failures. If read or write failures are identified, the associated body bias values of Vwf and Vrf may be ascertained.

At step 146, an optimum body bias may be determined. For example, the tester or other computer equipment can compute the mean of Vrf and Vwf or may otherwise determine a suitable value of optimum address transistor body bias. If a write failure is detected but no read failures are detected, a body bias near the upper limit of the tested body biases may be selected as the optimum body bias value. If a read failure is detected but no write failures are detected, a body bias near the lower limit of the tested body biases may be selected as the optimum body bias value.

At step 148, tester 136 (or other suitable equipment) may store the optimum body bias setting in memory 120 of device 10 (FIG. 16). For example, the optimum body bias setting may be stored by electrically programming polysilicon fuses or other suitable programmable elements on device 10. The stored body bias setting configures voltage regulator circuitry 118 so that the optimum address transistor body bias voltage Vpw is produced on line 128 (FIG. 16).

Once the device 10 has been adjusted in this way, the device can be shipped to a user for incorporation into a system. The selection of the optimum address transistor body bias may be performed during manufacturing, so that the user need not be concerned with this type of adjustment. Parts that have been adjusted in this way will exhibit enhanced memory array stability, because a body bias has been selected that minimizes read failures and write failures.

The foregoing is merely illustrative of the principles of this invention and various modifications can be made by those skilled in the art without departing from the scope and spirit of the invention.

What is claimed is:

1. A method for stabilizing a memory array on an integrated circuit, wherein the memory array contains memory cells that are addressed using address transistors on the memory array and wherein the address transistors comprise body bias terminals, the method comprising:
    testing the memory array with a tester that is coupled to the integrated circuit during testing, wherein testing the memory array comprises performing read tests on the memory array to obtain read test data and performing write tests on the memory array to obtain write test data;
    with the tester, analyzing the read test data and the write test data to determine an optimum body bias for the address transistors on the memory array to enhance memory cell stability; and
    storing a setting for the optimum body bias in the integrated circuit so that the optimum body bias will be applied to the address transistors on the memory array during normal operation of the integrated circuit.

2. The method defined in claim 1 wherein testing the memory array comprises performing the read and write tests at various address transistor body biases.

3. The method defined in claim 1 further comprising:
    identifying a maximum acceptable body bias voltage above which read failures occur; and
    identifying a minimum acceptable body bias voltage below which write failures occur.

4. The method defined in claim 1 wherein the integrated circuit comprises a nonvolatile memory and a programmable voltage regulator that is controlled by the nonvolatile memory and wherein storing the setting comprises storing the setting for the optimum body bias in the nonvolatile memory so that the programmable voltage regulator applies the optimum body bias to the address transistors.

5. A method comprising:
    testing a memory array on an integrated circuit with a tester that is coupled to the memory array during testing, wherein the memory array comprises address transistors having body bias terminals and wherein testing the memory array comprises performing read and write tests on the memory array;
    with the tester, analyzing results from the testing to determine a body bias for the address transistors on the memory array, wherein the results include read and write failures;
    in response to detecting a read failure, adjusting the body bias in a given direction;
    in response to detecting a write failure,
    adjusting the body bias in another direction opposite to the given direction;
    storing a setting for the body bias in the integrated circuit; and
    during normal operation of the integrated circuit, outputting static control signals with the memory array.

6. The method of claim 5 further comprising:
    applying the body bias to the address transistors on the memory array.

7. The method defined in claim 5, wherein testing the memory array comprises identifying read failures and write failures at various address transistor body biases.

8. The method defined in claim 5 further comprising:
    identifying a maximum acceptable body bias voltage above which read failures occur.

9. The method defined in claim 5 further comprising:
    identifying a minimum acceptable body bias voltage below which write failures occur.

10. The method defined in claim 5, wherein the integrated circuit comprises a nonvolatile memory, and wherein storing the setting comprises storing the setting for the body bias in the nonvolatile memory.

11. The method defined in claim 5, wherein the integrated circuit comprises a programmable voltage regulator, the method further comprises:
    applying the body bias to the address transistors on the memory array with the programmable voltage regulator.

12. The method defined in claim 5 further comprising:
applying the body bias to the address transistors on the memory array during normal operation of the integrated circuit, wherein the tester is not coupled to the integrated circuit during normal operation.

13. The method defined in claim 5, wherein the integrated circuit further comprises voltage regulator circuitry, and wherein testing the memory array on the integrated circuit with the tester comprises:
sending control signals from the tester to the voltage regulator circuitry on the integrated circuit.

14. A programmable logic device comprising:
programmable logic on an integrated circuit, wherein the programmable logic is operable to be powered at a core logic power supply voltage;
an array of memory cells arranged in rows and columns on the integrated circuit;
address lines associated with the rows of the memory cells;
data lines associated with the columns of the memory cells;
precharge driver circuitry operable to supply a precharge voltage that is less than the core logic power supply voltage to the data lines before memory cell reading operations, wherein the memory cells each comprise at least one address transistor having a body bias terminal, the programmable logic device further comprising:
nonvolatile memory on the integrated circuit in which an address transistor body bias setting is stored; and
a programmable voltage regulator on the integrated circuit, wherein the programmable voltage regulator is operable to supply a body bias to the body bias terminal of each of the address transistors based on the address transistor body bias setting stored in the nonvolatile memory.

15. The programmable logic device defined in claim 14 wherein the body bias that the programmable voltage regulator is operable to supply to the body bias terminal of each of the address transistors comprises a positive body bias.

16. The programmable logic device defined in claim 14 wherein the body bias that the programmable voltage regulator is operable to supply to the body bias terminal of each of the address transistors comprises a negative body bias.

17. The programmable logic device defined in claim 14 wherein the precharge driver circuitry comprises a plurality of precharge drivers, wherein a respective one of the precharge drivers is connected to each of the data lines, wherein each precharge driver includes an n-channel metal-oxide-semiconductor transistor, wherein the memory cells are dual-port memory cells, and wherein the at least one address transistor having a body bias terminal comprises four address transistors each having a body bias terminal.

* * * * *